United States Patent
Bliss et al.

(10) Patent No.: US 6,228,734 B1
(45) Date of Patent: May 8, 2001

(54) METHOD OF MANUFACTURING A CAPACITANCE SEMI-CONDUCTOR DEVICE

(75) Inventors: John Bliss, Tempe; Lynn William Ford, Scottsdale, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/229,099

(22) Filed: Jan. 12, 1999

(51) Int. Cl.⁷ .................................................. H01L 27/15
(52) U.S. Cl. ........................................................... 438/379
(58) Field of Search ........................... 257/598, 599, 257/600; 438/379, FOR 415

(56) References Cited

U.S. PATENT DOCUMENTS 3,685,141 * 8/1972 Sandera .
4,874,484 10/1989 Foell et al. .

* cited by examiner

Primary Examiner—George Fourson
Assistant Examiner—Thanh V. Pham
(74) Attorney, Agent, or Firm—Robert D. Atkins; Michael T. Wallace

(57) ABSTRACT

A variable capacitance semiconductor device (10) such as a varactor diode, is formed to have a plurality of openings (13), such as a plurality of trenches, that cause the depletion regions (16) to overlap. This overlap results in a rapid change of capacitance for a given change of voltage, and allows efficient operation over a small voltage range.

7 Claims, 2 Drawing Sheets

METHOD OF MANUFACTURING A CAPACITANCE SEMI-CONDUCTOR DEVICE

BACKGROUND OF THE INVENTION

The present invention relates, in general, to semiconductor devices, and more particularly to variable capacitance semiconductor devices.

In the past, the semiconductor industry has utilized various structures and methods to implement variable capacitance semiconductor devices such as varactor diodes, tuning diodes, and varicaps. Typically, these variable capacitance devices are formed by diffusing a dopant into a semiconductor material to form a single P-N junction and making electrical contact to the diffused region. A reverse voltage is applied that forms a depletion region around the diffusion. This depletion region has a capacitance associated thereto. As the voltage is varied, the value of the capacitance also varies.

The present trend to very low operating voltage creates a need to have a variable capacitance device that has a large capacitance density variation for a small change in voltage (pf/micron$^2$/volt. Typically, prior art variable capacitance devices vary up to $1 \times 10^{-4}$ pico-farad per square micron per volt.

Accordingly, it is desirable to have a variable capacitance semiconductor device that has a capacitance that varies rapidly for a small change in voltage, and that has a variable capacitance range of approximately three volts.

DETAILED DESCRIPTION OF THE DRAWINGS

Figure 1:
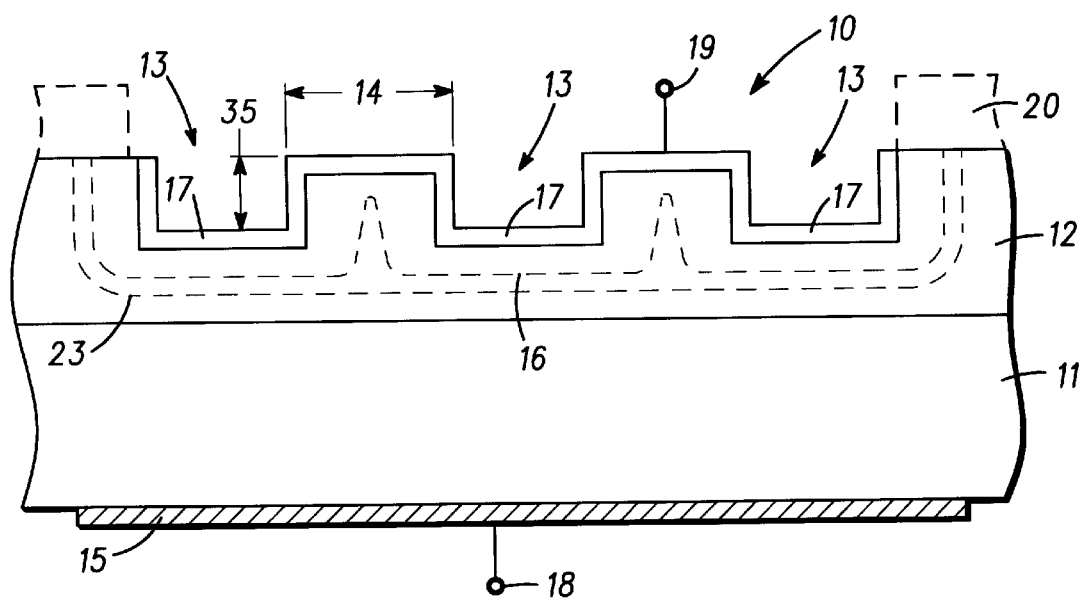
FIG. 1 illustrates a cross-sectional portion of an embodiment of a variable capacitance semiconductor device in accordance with the present invention.

FIG. 1 illustrates a cross-sectional view of a portion of a variable capacitance semiconductor device 10, such as a varactor diode, that has a large change in capacitance for a small change in voltage. Device 10 includes a semiconductor substrate 11 that is formed from a semiconductor material that has a first surface on which diffused portions of device 10 are formed. Substrate 11 may include a doped semiconductor layer 12 formed by doping a portion of the first surface of substrate 11 or layer 12 may be an epitaxial layer that is formed on a semiconductor material as a part of substrate 11. The dopant in layer 12 may be graded between the surface and the interface with substrate 11 to enhance the abruptness of a junction formed at the interface with an active layer 17 which is discussed further hereinafter. Substrate 11 and layer 12 typically have the same dopant type, for example N-type, although the conductivity of substrate 11 typically is much higher than the conductivity of layer 12, for example 300 to 400 times higher. A plurality of openings 13 are formed in surface of substrate 11 or layer 12 of substrate 11. Openings 13 can be a variety of shapes, as will be seen hereinafter in the description of FIG. 4. Generally, each opening 13 has a shape that provides a surface area around each opening 13 that results in a total surface area that is larger than the area each opening 13 occupies along the surface of substrate 11 or layer 12. For the sake of simplicity of the explanation, openings 13 are shown in FIG. 1 as a plurality of trenches formed in parallel strips across the surface of substrate 11. Plurality of openings 13 are formed in the surface of layer 12 by techniques that are well known to those skilled in the semiconductor art. For example, openings 13 may be formed by wet chemical etching or reactive ion etching. Although openings 13 are shown to have vertical sidewalls and flat bottoms, openings 13 may have a variety of shapes along the sidewalls including sloped or curved sidewalls.

After etching openings 13, a dopant is positioned into openings 13 to form active layer 17 of device 10. The dopant may be positioned by diffusion, implanting, or other techniques that are well known to those skilled in the art. Typically, a mask 20 (illustrated by a dashed line) is used to isolate the dopant to desired areas of device 10. The dopant used for layer 17 is a conductivity type that is opposite to the type of dopant used for layer 12 in order to form a P-N, junction along the boundary of layer 17 and layer 12. Typically, the dopant is positioned in the sidewalls and the bottoms of openings 13 in addition to the surface of layer 12 that separates openings 13.

After forming layer 17, a contact 19 is formed to make electrical contact to layer 17. Contact 19 may be a layer of metal (not shown) that is formed along the entire surface of layer 17. An electrical contact 18 is formed on the second surface of substrate 11 which is opposite to the surface of which the active elements of device 10 are formed. Typically, a contact 15 is formed on a bottom surface or surface of substrate 11 that is opposite to the surface in which openings 13 are formed. Such contacts and methods of forming such contacts are well known to those skilled in the semiconductor art.

Each of the plurality of openings 13 have a lateral spacing between each opening 13 that is used to separate each opening 13 from other openings 13. Openings 13 also have a depth 35 into layer 12 or substrate 11. The function of spacing 14 and depth 35 is explained further in the description of FIG. 3. In operation, a voltage is applied between contacts 18 and 19 in order to reverse bias the P-N junction formed by layer 17 and layer 12. This reverse bias forms a depletion region 16 (illustrated by a dashed line) along the boundary of the P-N junction. As the reverse voltage is increased, the depletion region expands to occupy more of the space of layer 12. The depletion region along each sidewall increases laterally at a faster rate than the depletion region along the bottom increases vertically. The region along the sidewalls of each opening 13 spreads or expands until the depletion region of each trench of the plurality of openings overlaps at least a portion of the depletion region that is formed by the adjacent trench. The overlap of each depletion region dramatically increases the area of the depletion region and this in turn dramatically increases the associated change in capacitance for a change of the voltage that is applied to device 10. The depletion region continues to expand laterally and vertically and eventually becomes a flat line displaced vertically from the bottom of the openings. This condition is illustrated by a dashed line 23 and can be consider as forming a substantially continuous depletion region for all the plurality of openings 13. At this point, the rate of change of capacitance for a given change in voltage becomes flatter and the capacitance no longer changes rapidly for a given change of voltage.

The area of the junction of device 10 is increased by the openings because the area now includes the area along each sidewall of each opening 13 in addition to the area along the bottom of each opening 13.

Figure 2:
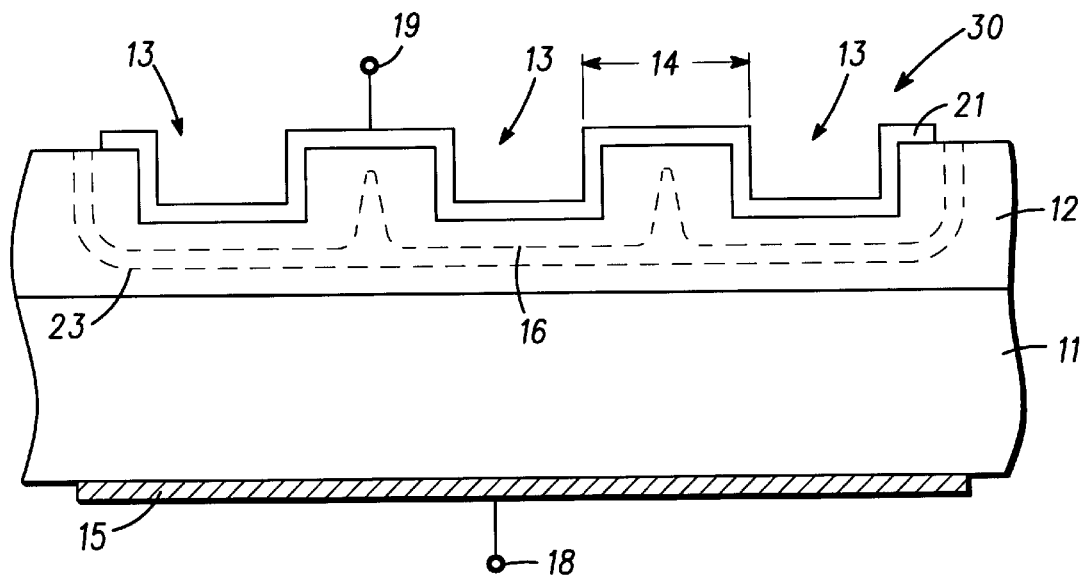
FIG. 2 illustrates a cross-sectional portion of an alternate embodiment of a variable capacitance semiconductor device in accordance with the present inventions.

FIG. 2 illustrates a variable capacitance semiconductor device 30 that is an alternate embodiment of device 10 shown in FIG. 1. Elements of FIG. 2 that are similar to elements of FIG. 1 have the same reference numbers. After forming openings 13, a material 21 that forms a Schottky barrier junction with the material of layer 12. As a result, a Schottky barrier junction is formed between the surface of layer 12 and material 21 at the interface thereof. Device 30 functions similarly to device 10 of FIG. 1.

Figure 3:
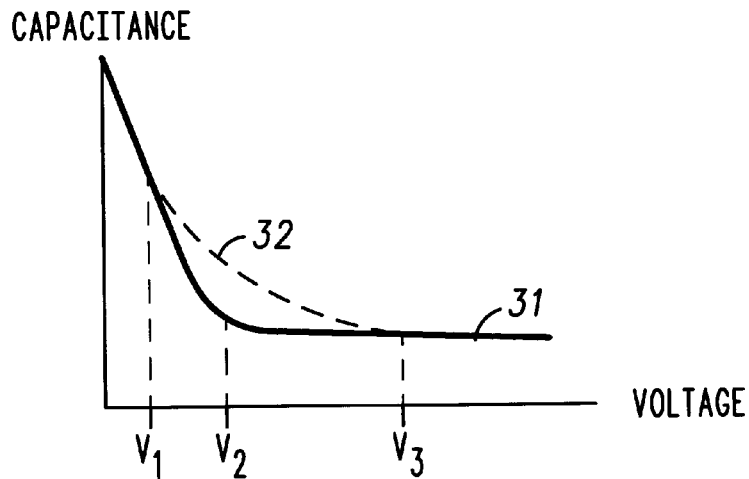
FIG. 3 is a plot schematically illustrating the capacitance and voltage relationship of the variable capacitance semiconductor devices shown in FIG. 1 and FIG. 2 in accordance with the present invention.

FIG. 3 is a graph having a plot 31 that illustrates the capacitance verses voltage relationship of device 10 and device 30. As a reverse voltage is initially applied to device 10 or device 30, the capacitance of the device decreases for each change of reverse voltage. The reverse voltage is applied to the device until the depletion region of each opening intersects and begins to overlap the depletion region of an adjacent opening at a voltage $V_1$. As the depletion regions overlap, the change in capacitance decreases faster for a given change in voltage because the average volume of the depletion region is increasing faster for the given change in voltage than the average volume of the depletion region was decreasing for the same change in voltage before the depletion regions overlapped. The effect of the overlap of adjacent depletion regions is shown in FIG. 3 at the voltage V where plot 31 shows the rate of change of capacitance begins to decrease at a faster rate. This rapid decrease of capacitance for a change in voltage continues until the depletion regions merge and form one single depletion region, illustrated by dashed line 23 in FIG. 1 and FIG. 2, and the result is illustrated at voltage $V_2$ in FIG. 3 where plot 31 begins to flatten. As the reverse voltage applied to device 10 and device 30 increases above $V_2$, the change of capacitance for a given change in voltage changes at a slower rate as shown by the flat section of plot 31 between voltage $V_2$ and $V_3$. The rate of change of capacitance as a function of voltage for prior art variable capacitor devices is shown as dashed line plot 32 in FIG. 3. The difference between plot 31 and plot 32 illustrates the much faster rate of change of capacitance for a change of voltage that can be achieved with device 10 and device 30.

The values chosen for spacing 14 and depth 35, and the doping concentration of layer 12 is a function of the voltage range over which it is desired that devices 10 and 30 have a large change of capacitance. The distance used for spacing 14 and the doping of layer 12 is chosen to provide an overlap of depletion regions from adjacent openings 13 at the lowest desired voltage $V_1$. Depth 35 is chosen to provide flattening of the depletion regions at the highest desired operating voltage $V_2$. In one embodiment, device 10 has a low operating voltage $V_1$ of approximately 0.5 volts and a highest operating voltage $V_2$ of approximately 3.0 volts. This embodiment also has spacing 14 of approximately two microns and depth 30 of approximately five microns. Such an example of device 10 typically has a capacitance density greater than $2 \times 10^{-4}$ to $3 \times 10^{-4}$ pico-farad per square micron per volt. Other configurations of device 10 can achieve a capacitance density of at least $10 \times 10^{-4}$ pico-farad per square micron per volt. Such devices can provide large capacitance changes over a small voltage range.

Figure 4:
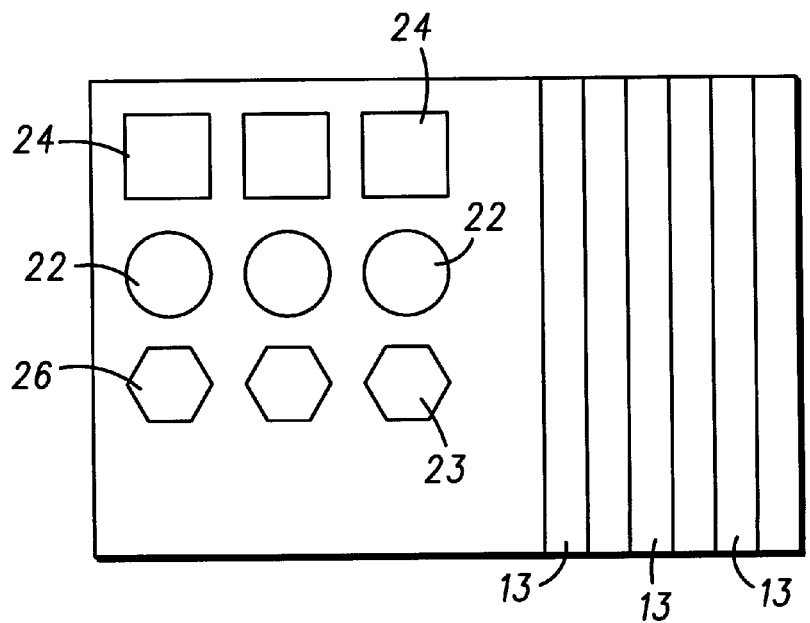
FIG. 4 is a plan view schematically illustrating alternate shapes for the variable capacitance semiconductor devices of FIG. 1 and FIG. 2 in accordance with the present invention.

FIG. 4 is a plan view of some of the various shapes that can be used for openings 13 of device 10 and device 30.

Elements of FIG. 4 that are the same as elements of FIG. 1 and FIG. 2 have the same reference numbers. Openings 13 as shown in FIG. 1 and FIG. 2 are formed as a plurality of stripes running along the surface of substrate 11. However, openings 13 could have other shapes such as circles 22 or various polygons such as squares 24, hexagons 26, or various other shapes such as triangles, trapezoids, or parallelograms. Typically, the polygons are formed as openings that are etched into the surface of device 10 or device 30.

By now it should be apparent that there has been provided a novel variable capacitance semiconductor device and method. Forming a plurality of adjacent openings there separated by a lateral distance allows forming a depletion region along the sidewalls of each trench so that the depletion region formed along each sidewall will overlap a depletion region of an adjacent trench. This overlap increases the rate of change of capacitance as a function of voltage thereby providing a variable capacitance device that can operate at low voltages because of the large change in capacitance for small change in voltage. The invention also provides for efficient operation and large capacitance change over a small voltage range, such as three volts.

What is claimed is:

1. A method of forming a variable capacitance semiconductor device, comprising:

providing a semiconductor substrate of a first conductivity type having first and second surfaces;

forming a plurality of openings having sidewall and bottom surfaces in the first surface of the semiconductor substrate; and forming a continuous active layer of a second conductivity type over the first surface of the semiconductor substrate and the sidewall and bottom surfaces of the openings.

2. The method of claim 1 wherein forming the continuous active layer comprises confining a dopant of the second conductivity type to the sidewall and bottom surfaces of the openings and the first surface of the semiconductor substrate separating the openings.

3. A method of forming a voltage controlled variable capacitance semiconductor device, comprising:

forming cavities in a first surface of the semiconductor device having a first conductivity type; and doping the cavities and the first surface of the semiconductor device with a dopant of a second conductivity type to create a continuous P-N junction wherein doping the cavities and the first surface of the semiconductor device comprises using a mask to confine the dopant to the cavities and a surface of the semiconductor device separating the cavities.

4. The method of claim 3 further comprising:

providing a first electrode in contact with a first surface of the P-N junction; and providing a second electrode in contact with a second surface of the P-N junction, wherein the first and second electrodes provide control terminals for the variable capacitance semiconductor device.

5. A method of forming a variable capacitance semiconductor device having a voltage controlled depletion region, comprising:

etching laterally separated trenches into a first surface of a semiconductor substrate having a first conductivity type; and forming a continuous dopant layer of a second conductivity type over the trenches and the semiconductor substrate to form the voltage controlled depletion region wherein etching the laterally separated trenches comprises controlling a depth and a width of the trenches to maximize a voltage range of depletion region control.

6. The method of claim 5 wherein forming the continuous dopant layer comprises masking a dopant to confine the dopant to the trenches and the semiconductor substrate separating the trenches.

7. The method of claim 5 further comprising:
providing a first electrode in contact with the dopant layer; and
providing a second electrode in contact with a second surface of the semiconductor substrate, wherein the first and second electrodes provide control terminals for the voltage controlled depletion region.

* * * * *